United States Patent [19]
de Ronde

[11] Patent Number: 4,484,163
[45] Date of Patent: Nov. 20, 1984

[54] ARRANGEMENT FOR BIASING HIGH-FREQUENCY ACTIVE COMPONENTS

[75] Inventor: Frans C. de Ronde, Lesigny, France

[73] Assignee: U.S. Philips Corporation, New York, N.Y.

[21] Appl. No.: 380,634

[22] Filed: May 21, 1982

[30] Foreign Application Priority Data

May 27, 1981 [FR] France ................................ 81 10571

[51] Int. Cl.³ .............................................. H01P 1/00
[52] U.S. Cl. ..................................... 333/247; 333/204
[58] Field of Search ................. 333/204, 238, 246, 247

[56] References Cited

U.S. PATENT DOCUMENTS 4,023,125  5/1977  Wolfe .................................... 333/238
4,288,766  9/1981  Okita ................................. 333/246 X
4,327,342  4/1982  de Ronde ........................ 333/246 X Primary Examiner—Paul L. Gensler
Attorney, Agent, or Firm—Robert J. Kraus

[57] ABSTRACT

An arrangement for applying a DC bias current to an RF active component, such as a field effect transistor, serially-connected with an RF transmission line. The biasing current is supplied by a transmission line section connected at a junction to the transmission line. Two conductive strips, connected in parallel with the transmission line, on opposite sides of the junction, form a band-pass filter. Each of these strips is situated at a distance from the junction which is equal to approximately one-eighth of the wavelength of the signal frequency transmitted on the transmission line.

2 Claims, 2 Drawing Figures

ARRANGEMENT FOR BIASING HIGH-FREQUENCY ACTIVE COMPONENTS

BACKGROUND OF THE INVENTION

The present invention relates to an arrangement for biasing radio-frequency (RF) active components, which are formed in a planar structure in accordance with printed circuit techniques on a dielectric support. A power supply circuit applies a direct biasing current to an active RF component, which is arranged in series with a main transmission line 1, via a transmission line section (4) provided between the circuit and the main transmission line. At a point (6), where transmission line section (4) is connected to the main line, the impedance is sufficiently high to prohibit the transmission of the RF signal passing through the main line (1) to the power supply circuit, while allowing the transmission of the direct current produced by said circuit. The arrangement can be used for biasing RF active components such as diodes or transistors, and more specifically field effect transistors formed in a planar structure in accordance with printed circuit techniques on a dielectric support.

U.S. Pat. No. 4,023,125 filed on Oct. 17th, 1975 by General Electric Company, and published May 10th, 1977 discloses circuits for biasing RF components. The circuits comprise a transmission line section having a high impedance at its junction with the main transmission line through which the RF signal is conveyed. In said circuits it is tried to increase the passband by means of a chain of series-connected transmission line segments, which on the one hand results in a comparatively bulky arrangement and on the other hand does not prevent parasitic reflections from becoming increasingly significant with increasing deviation from the resonant frequency of the transmission line section.

SUMMARY OF THE INVENTION

The invention has for its object to provide a biasing arrangement of the type described in the opening paragraph, and which is both very compact and has a wide frequency band.

To this end, the invention relates to an arrangement for biasing RF active components which are formed in a planar structure in accordance with printed circuit techniques on a dielectric support. A power supply circuit applies a direct biasing current to an RF active component, which is arranged in series with the main transmission line, via a transmission line section provided between the circuit and the main transmission line. At its junction with the main line the impedance is sufficiently high to prohibit the transmission of the RF signal passing through the main line to the power supply circuit, while allowing the transmission of the direct current produced by the circuit. The impedance comprises a filtering device of the bandpass type turned to the RF signal, formed by two conducting strips which are connected in parallel to the main transmission line, symmetrically on both sides of the junction of the line section with the main line, and are spaced from each other by approximately one-quarter wavelength of the signal frequency.

With the above-proposed construction the reflections which are produced in the two conducting strips cancel each other when they are at the signal frequency, as they have the same amplitudes and are oppositely directed. At frequencies below the signal frequency the residual reflections due to the conducting strips, which are capacitive, compensate (by means of a suitable choice of the values of the capacitances of these strips) the reflections due to the transmission line section (which itself has an inductive nature below the signal frequency). This compensation is effective over a considerable frequency band greater than one octave.

BRIEF DESCRIPTION OF THE DRAWING

The invention and its advantages will now be described with reference to the accompanying drawing which shows, by way of non-limitative example, an embodiment of the invention and in which.

BRIEF DESCRIPTION OF THE PREFERRED EMBODIMENTS

Figure 1:
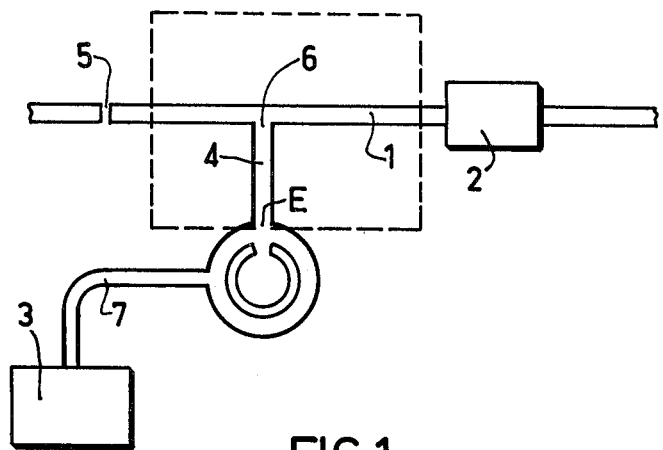
FIG. 1 shows a prior art biasing arrangement.

An example of the biasing arrangement in accordance with the prior art is shown in FIG. 1 and comprises a main RF transmission line 1 incorporating, arranged in series, a field effect transistor 2. A power supply circuit 3 applies the biasing voltage to the transistor 2 by means of a transmission line section 4 provided between the circuit 3 and the main line 1. The line section 4 has in the junction 6 where it is connected to the main line 1 a high impedance which, while allowing the biasing current to be applied to the transistor 2, prevents the RF signal flowing through the line 1 from being reflected towards the power supply circuit 3. This high impedance is obtained by giving the line section 4 a length equal to one-quarter of the wavelength of the signal frequency and by providing between the junction of the output 7 of the power supply circuit 3 and the end E of said section 4 a device which defines in the point E a short-circuiting plane. This is seen at point 6, at the other end of the section 4, as an impedance of a very high value. A capacitive element 5 is provided in the main line 1 to inhibit the flow of the biasing current in the direction opposite to that of the transistor.

Figure 2:
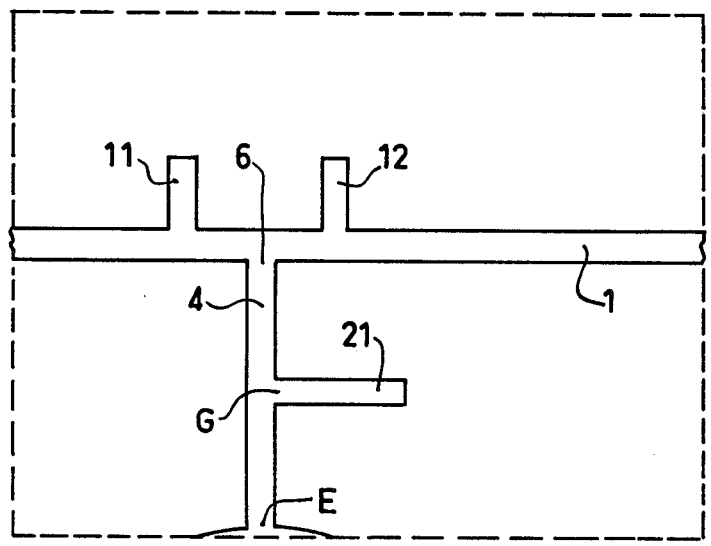
FIG. 2 shows the biasing arrangement in accordance with the invention.

According to the invention, the biasing arrangement described in the foregoing comprises inter alia, as shown in FIG. 2 which is an enlarged view of a portion of FIG. 1 and which shows the original components of said arrangement, a bandpass filter for the RF signal, formed by two conducting strips 11 and 12, which are arranged in parallel with the main line 1. These strips which are placed symmetrically on both sides of the junction 6 where the line section 4 is connected to the line 1, are situated at a distance from each other equal to one-quarter of the wavelength of the signal frequency. At the signal frequency the reflections of the signal which are produced at one of the strips are accurately cancelled by reflections having the same amplitude but which are of the opposite sign which are produced at the other line. At frequencies below the signal frequency, the strips 11 and 12 are the source of reflections which do not cancel each other. However, these strips are capacitive and the values of their capacitances can be chosen in such a way that, for a pass band of more than one octave, they compensate the inductive effect of the transmission line section. The section λ/4 of the transmission line is comparable to an inductance below the signal frequency and comparable to a capacitor above the signal frequency.

A quarter-wave circuit 21 may be arranged in parallel with the line section 4 to form therewith a load which is capable of avoiding, by means of the impedance which this circuit produces in the junction 6 at a frequency which is twice the signal frequency, the presence of a short-circuit in said junction 6. If circuit 21 were absent, a short circuit would occur at a frequency twice the signal frequency. This circuit 21 is a conductive strip having a length equal to one-quarter of the length of a wave associated with said double frequency (that is to say with one-eighth of the wavelength of the signal frequency) and connected to the line section 4 in a point G which is located at a distance from junction 6 which is also equal to one-quarter length of the wave associated with the double frequency. Point G is located half-way along the line section.

It must be understood that the present invention is not limited to the embodiment described in the foregoing and shown in the drawing, on the basis of which several variations can be proposed without departing from the framework or the scope of the invention.

What is claimed is:

1. A circuit arrangement comprising planar conductors on a dielectric support for carrying a DC bias signal to an active RF component, said arrangement including an RF transmission line connected to the active RF component and a transmission line section connected at a junction to the RF transmission line for supplying a DC bias signal to the active RF component, said transmission line section presenting to the RF transmission line a high RF impedance and a low DC impedance, thereby inhibiting passage on the section of an RF signal having a predefined frequency carried by the RF transmission line but allowing passage on the section of the DC bias signal, wherein the improvement comprises a band-pass filter including first and second conductive strips connected in parallel with the RF transmission line on opposite side of said junction, each of said conductive strips being spaced from said junction by a distance approximately equal to one-eighth of the wavelength corresponding to the predefined frequency.

2. A circuit arrangement as in claim 1 including a third conductive strip connected in parallel with the transmission line section at a distance from said junction approximately equal to one-eighth of the wavelength corresponding to the predefined frequency and having a length approximately equal to one-eighth of said wavelength.

* * * * *